United States Patent
Lee

(10) Patent No.: US 11,943,965 B2
(45) Date of Patent: Mar. 26, 2024

(54) DISPLAY DEVICE INCLUDING A LOWER ELECTRODE

(71) Applicant: SAMSUNG DISPLAY CO., LTD., Yongin-si (KR)

(72) Inventor: Hyeonbum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 561 days.

(21) Appl. No.: 17/014,534

(22) Filed: Sep. 8, 2020

(65) Prior Publication Data
US 2021/0111379 A1    Apr. 15, 2021

(30) Foreign Application Priority Data

Oct. 15, 2019    (KR) .................... 10-2019-0127895

(51) Int. Cl.
| | |
|---|---|
| *H10K 50/86* | (2023.01) |
| *H10K 50/813* | (2023.01) |
| *H10K 50/818* | (2023.01) |
| *H10K 59/123* | (2023.01) |
| *H10K 59/35* | (2023.01) |

(52) U.S. Cl.
CPC .......... *H10K 50/86* (2023.02); *H10K 50/813* (2023.02); *H10K 50/818* (2023.02); *H10K 59/123* (2023.02); *H10K 59/35* (2023.02)

(58) Field of Classification Search
None
See application file for complete search history.

(56) References Cited

U.S. PATENT DOCUMENTS

| | | | |
|---|---|---|---|
| 2011/0031876 A1* | 2/2011 | Park ..................... | H10K 50/852 313/504 |
| 2017/0148860 A1* | 5/2017 | Park ..................... | H10K 59/121 |
| 2019/0252470 A1 | 8/2019 | Lee | |

FOREIGN PATENT DOCUMENTS

| | | |
|---|---|---|
| KR | 10-0666553 | 1/2007 |
| KR | 10-1116825 | 2/2012 |
| KR | 10-2019-0060910 | 6/2019 |
| KR | 10-2019-0064051 | 6/2019 |
| KR | 10-2019-0095630 | 8/2019 |

OTHER PUBLICATIONS

Office Action dated Jul. 27, 2023 from the Korean Intellectual Property Office (KIPO) for Korean Patent Application No. 10-2019-0127895.

* cited by examiner

*Primary Examiner* — Suberr L Chi
(74) *Attorney, Agent, or Firm* — F. Chau & Associates, LLC

(57) ABSTRACT

A display device, includes: a substrate; a first thin film transistor and a second thin film transistor disposed on the substrate; a via insulating layer disposed on the substrate, wherein the via insulating layer includes a first contact hole and a second contact hole, wherein the first contact hole exposes a portion of the first thin film transistor, and the second contact hole exposes a portion of the second thin film transistor; a first pixel structure disposed on the via insulating layer, wherein the first pixel structure overlaps the first thin film transistor, and includes a first lower electrode; and a second pixel structure spaced apart from the first pixel structure, wherein the second pixel structure overlaps the second thin film transistor, and includes a second lower electrode having a shape different from a shape of the first lower electrode.

3 Claims, 8 Drawing Sheets

DISPLAY DEVICE INCLUDING A LOWER ELECTRODE

CROSS-REFERENCE TO RELATED APPLICATION(S)

This application claims priority under 35 U.S.C. § 119 to Korean Patent Application No. 10-2019-0127895, filed on Oct. 15, 2019 in the Korean Intellectual Property Office (KIPO), the disclosure of which is incorporated by reference herein in its entirety.

TECHNICAL FIELD

Exemplary embodiments of the present inventive concept relate generally to a display device. More particularly, exemplary embodiments of the present inventive concept relate to the display device including a lower electrode.

DISCUSSION OF THE RELATED ART

Generally, a display device may include a plurality of pixel structures for displaying an image, and each of the pixel structures may include a lower electrode, an emission layer, and an upper electrode. The lower electrode may typically be divided into a central region and a peripheral region surrounding the central region. Further, the emission layer may be disposed on the central region of the lower electrode, and the upper electrode may be disposed on the emission layer. A light having a predetermined color (e.g., red, green, or blue colors) may be emitted from the emission layer by applying voltages to the lower electrode and the upper electrode.

In addition, as a light incident from an outside (e.g., an external light) is reflected from the lower electrode, a reflected light having a path different from a path of a light emitted from an emission layer may occur. Further, the reflected light may occur more frequently in the periphery region of the lower electrode where the emission layer is not disposed. In addition, the reflected lights having predetermined colors may interfere with each other, so that the reflected lights that are interfering with each other generate a color band having a color different from a color of the light emitted from the emission layer. The color band blurs the color of the light emitted from the pixel structure.

SUMMARY

According to an exemplary embodiment of the present inventive concept, a display device, includes: a substrate; a first thin film transistor and a second thin film transistor disposed on the substrate; a via insulating layer disposed on the substrate, wherein the via insulating layer includes a first contact hole and a second contact hole, wherein the first contact hole exposes a portion of the first thin film transistor, and the second contact hole exposes a portion of the second thin film transistor; a first pixel structure disposed on the via insulating layer, wherein the first pixel structure overlaps the first thin film transistor, and includes a first lower electrode; and a second pixel structure spaced apart from the first pixel structure, wherein the second pixel structure overlaps the second thin film transistor, and includes a second lower electrode having a shape different from a shape of the first lower electrode.

In an exemplary embodiment of the present inventive concept, the first lower electrode includes: a first transparent electrode overlapping a first region, a second region and a third region of the display device, wherein the second region is located at a first side of the first region, and the third region is located at a second side of the first region; a first reflective electrode disposed on the first transparent electrode, wherein the first reflective electrode overlaps the first region; and a second transparent electrode disposed on the first reflective electrode, wherein the second transparent electrode overlaps the first region.

In an exemplary embodiment of the present inventive concept, the first contact hole overlaps the second region.

In an exemplary embodiment of the present inventive concept, the first reflective electrode overlaps only the first region.

In an exemplary embodiment of the present inventive concept, the first reflective electrode extends to overlap at least a portion of the second region or at least a portion of the third region.

In an exemplary embodiment of the present inventive concept, the second lower electrode includes: a third transparent electrode overlapping a fourth region, a fifth region and a sixth region of the display device, wherein the fifth region is located at a first side of the fourth region, and the sixth region is located at a second side of the fourth region; a second reflective electrode disposed on the third transparent electrode, wherein the second reflective electrode overlaps the fourth region; and a fourth transparent electrode disposed on the second reflective electrode, wherein the fourth transparent electrode overlaps the fourth region.

In an exemplary embodiment of the present inventive concept, the second contact hole overlaps the fifth region.

In an exemplary embodiment of the present inventive concept, the second reflective electrode overlaps only the fourth region.

In an exemplary embodiment of the present inventive concept, the second reflective electrode extends to overlap at least a portion of the fifth region or at least a portion of the sixth region.

In an exemplary embodiment of the present inventive concept, wherein the second region is located below the first region, and wherein the fifth region is located above the fourth region.

In an exemplary embodiment of the present inventive concept, wherein the first reflective electrode extends to overlap the second region, and wherein the second reflective electrode extends to overlap the sixth region.

In an exemplary embodiment of the present inventive concept, wherein the first reflective electrode extends to overlap the third region, and wherein the second reflective electrode extends to overlap the fifth region.

In an exemplary embodiment of the present inventive concept, wherein the first pixel structure further includes a first emission layer overlapping the first region, wherein the second pixel structure further includes a second emission layer overlapping the fourth region, and wherein the first emission layer emits a light having a first color, and the second emission layer emits a light having a second color.

In an exemplary embodiment of the present inventive concept, the display device further includes: a pixel defining layer disposed between the first and second pixel structures, wherein the pixel defining layer overlaps the first and second contact holes.

In an exemplary embodiment of the present inventive concept, the display device further includes: a black matrix disposed on the pixel defining layer, wherein the black matrix does not overlap the first and second transparent electrodes.

According to an exemplary embodiment of the present inventive concept, a display device, includes: a substrate; a via insulating layer disposed on the substrate; a first lower electrode disposed on the via insulating layer; and a second lower electrode disposed on the via insulating layer, wherein the second lower electrode has a shape different from a shape of the first lower electrode, wherein the first lower electrode includes a first transparent electrode, a first reflective electrode, and a second transparent electrode, wherein the second lower electrode includes a third transparent electrode, a second reflective electrode, and a fourth transparent electrode, wherein the first transparent electrode overlaps a first central region of the first lower electrode and a first peripheral region, which is surrounding the first central region, of the first lower electrode, wherein the first reflective electrode is disposed on the first transparent electrode and overlaps the first central region, wherein the second transparent electrode is disposed on the first reflective electrode and overlaps the first central region, wherein the third transparent electrode overlaps a second central region of the second lower electrode and a second peripheral region, which is surrounding the second central region, of the second lower electrode, wherein the second reflective electrode is disposed on the third transparent electrode and overlaps the second central region, and wherein the fourth transparent electrode is disposed on the second reflective electrode and overlaps the second central region.

In an exemplary embodiment of the present inventive concept, the display device further includes: a pixel defining layer overlapping the first and second peripheral regions.

In an exemplary embodiment of the present inventive concept, the first reflective electrode overlaps only the first central region.

In an exemplary embodiment of the present inventive concept, the first reflective electrode extends to overlap at least a region of the first peripheral region.

According to an exemplary embodiment of the present inventive concept, a display device, incudes: a substrate; a first thin film transistor and a second thin film transistor disposed on the substrate; a via insulating layer disposed on the substrate and including a first contact hole and a second contact hole, wherein the first contact hole exposes a portion of the first thin film transistor, and the second contact hole exposes a portion of the second thin film transistor; a first pixel structure overlapping the first thin film transistor and including a first lower electrode including a first transparent electrode, a first reflective electrode, and a second transparent electrode, wherein the first reflective electrode is disposed on the first transparent electrode, and the second transparent electrode is disposed on the first reflective electrode, and wherein a portion of the first transparent electrode is exposed by the first reflective electrode and the second transparent electrode; and a second pixel structure overlapping the second thin film transistor and including a second lower electrode including a third transparent electrode, a second reflective electrode, and a fourth transparent electrode, wherein the second reflective electrode is disposed on the third transparent electrode, and the fourth transparent electrode is disposed on the second reflective electrode, and wherein a portion of the third transparent electrode is exposed by the second reflective electrode and the fourth transparent electrode.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
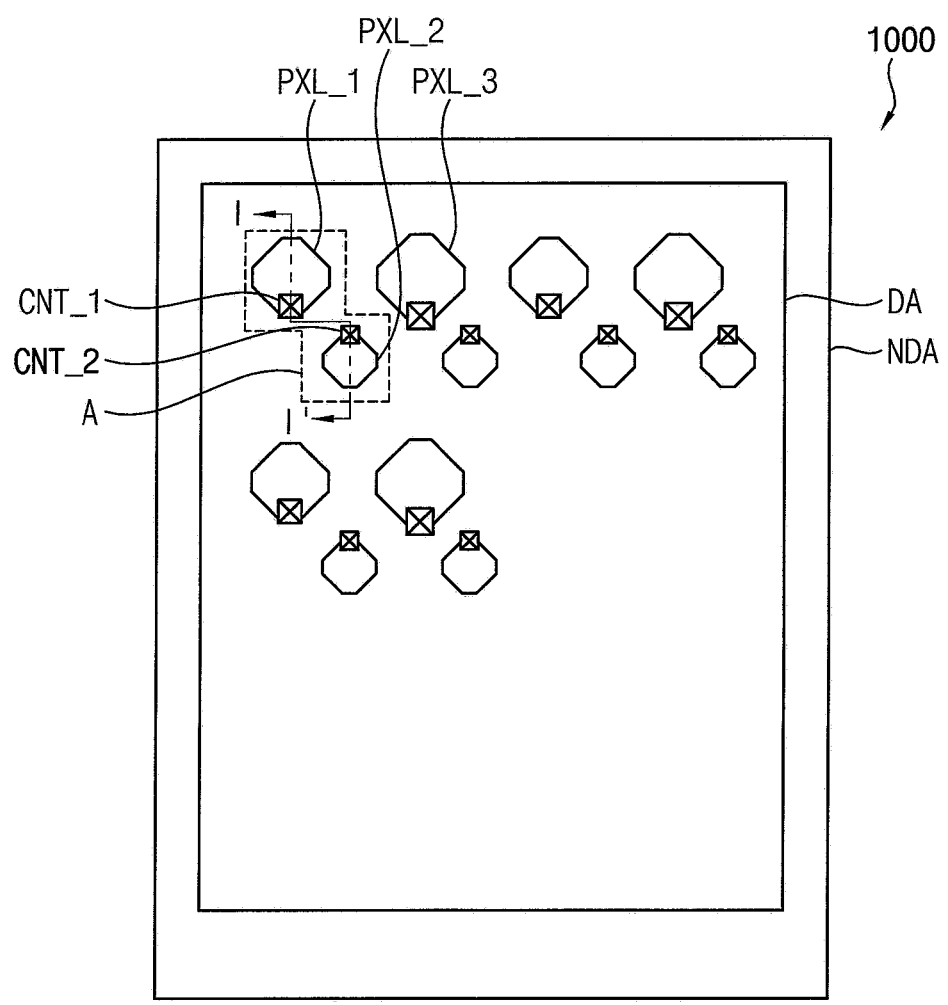
FIG. 1 is a diagram illustrating a display device according to an exemplary embodiment of the present inventive concept.

FIG. 1 is a diagram illustrating a display device according to an exemplary embodiment of the present inventive concept.

Referring to FIG. 1, the display device 1000 may be divided into a display area DA and a non-display area NDA.

A first pixel structure PXL_1, a second pixel structure PXL_2, and a third pixel structure PXL_3 are spaced apart from each other and may be disposed in the display area DA. For example, as shown in FIG. 1, the first to third pixel structures PXL_1, PXL_2 and PXL_3 may be arranged in a pentile manner. For example, the second pixel structure PXL_2 may be smaller than each of the first and third pixel structures PXL_1 and PXL_3.

In addition, wirings for providing a power and a signal to the first to third pixel structures PXL_1, PXL_2 and PXL_3 may be disposed in the display area DA.

The first to third pixel structures PXL_1, PXL_2 and PXL_3 may emit lights having first to third colors that are different from each other, respectively. For example, the first to third colors may be a red color, a green color, and a blue color, respectively.

Each of the first to third pixel structures PXL_1, PXL_2 and PXL_3 may be connected to a thin film transistor disposed on a substrate through a contact hole. For example, the first pixel structure PXL_1 may be connected to a thin film transistor through a first contact hole CNT_1. The power and the signal may be provided to the first pixel structure PXL_1 through the thin film transistor so that the first pixel structure PXL_1 emits a light having the first color. In addition, the second pixel structure PXL_2 may be connected to a thin film transistor through a second contact hole CNT_2. The power and the signal may be provided to the second pixel structure PXL_2 through a thin film transistor so that the second pixel structure PXL_2 emits a light having the second color.

In an exemplary embodiment of the present inventive concept, the first contact hole CNT_1 may be located at one side of the first pixel structure PXL_1, and the second contact hole CNT_2 may be located at one side of the second pixel structure PXL_2. For example, when viewed in a plan view, the first contact hole CNT_1 may be located below the first pixel structure PXL_1, and the second contact hole CNT_2 may be located above the second pixel structure PXL_2. However, the present inventive concept is not limited thereto.

In the display area DA of the display device 1000, an image may be displayed through the first to third pixel structures PXL_1, PXL_2 and PXL_3.

A power supply, a gate driver, and a data driver may be disposed in the non-display area NDA. The power supply may provide the power to the first to third pixel structures PXL_1, PXL_2 and PXL_3 through some of the wirings provided in the display area DA and connected to the first to third pixel structures PXL_1, PXL_2 and PXL_3. The gate driver and the data driver may provide a scan signal and a data signal, respectively, to the first to third pixel structures PXL_1, PXL_2 and PXL_3 through other wirings provided in the display area DA. In addition, the display device 1000 may further include a flexible printed circuit board disposed in the non-display area NDA, and the data driver may be disposed on the flexible printed circuit board.

Figure 2:
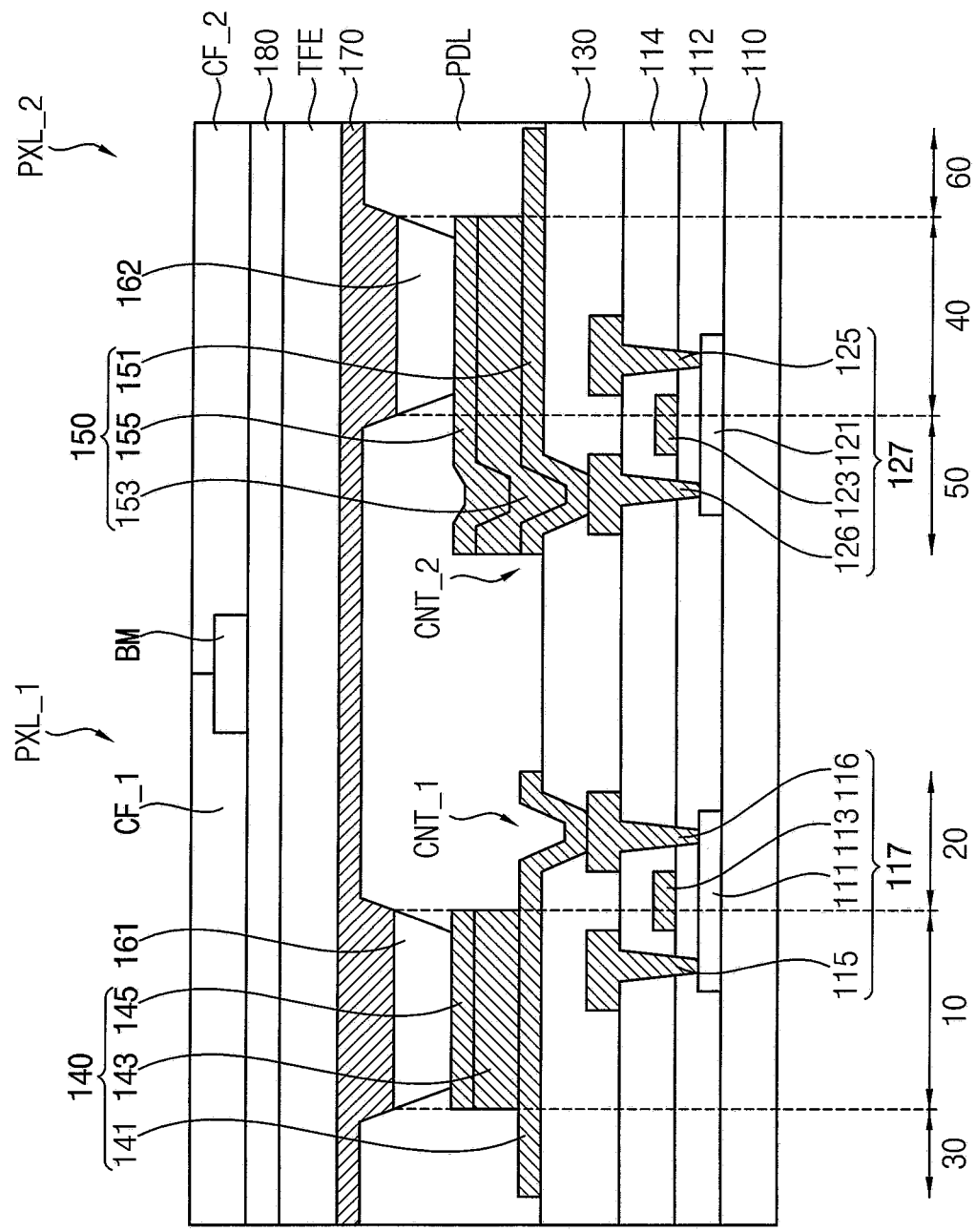
FIG. 2 is a cross-sectional view illustrating the display device according to an exemplary embodiment of the present inventive concept.

FIG. 2 is a cross-sectional view illustrating the display device according to an exemplary embodiment of the present inventive concept. For example, FIG. 2 is a cross-sectional view taken along line I-I' of the display device of FIG. 1.

Referring to FIGS. 1 and 2, the display device 1000 may include a substrate 110, a first thin film transistor 117, a second thin film transistor 127, a gate insulating layer 112, an interlayer insulating layer 114, a via insulating layer 130, a first lower electrode 140, a second lower electrode 150, a first emission layer 161, a second emission layer 162, an upper electrode 170, a pixel defining layer PDL, a thin film encapsulation layer TFE, a sensing structure 180, a first color filter CF_1, a second color filter CF_2, and a black matrix BM. The first thin film transistor 117 may include a first active pattern 111, a first gate electrode 113, a first source electrode 115, and a first drain electrode 116. The second thin film transistor 127 may include a second active pattern 121, a second gate electrode 123, a second source electrode 125, and a second drain electrode 126. The first lower electrode 140 may include a first transparent electrode 141, a first reflective electrode 143, and a second transparent electrode 145. The second lower electrode 150 may include a third transparent electrode 151, a second reflective electrode 153, and a fourth transparent electrode 155.

The substrate 110 may include a transparent material or an opaque material. For example, the substrate 110 may include a quartz substrate, a glass substrate, a plastic substrate, and the like. The plastic substrate may be a polyimide substrate having a ductility. For example, the substrate 110 may have a structure including at least one polyimide layer and at least one barrier layer alternately stacked with each other.

The first active pattern 111 and the second active pattern 121 may be disposed on the substrate 110. The first and second active patterns 111 and 121 may be formed by patterning an active layer after the active layer is deposited on the substrate 110. Each of the first and second active patterns 111 and 121 may include a source region doped with impurities, a drain region doped with impurities, and a channel region disposed between the source region and the drain region. For example, each of the first and second active patterns 111 and 121 may include an amorphous silicon, a polycrystalline silicon, or the like.

A buffer layer may be disposed between the substrate 110 and the first and second active patterns 111 and 121. The buffer layer may prevent a phenomenon in which metal atoms or impurities are diffused from the substrate 110 to the first and second thin film transistors 117 and 127. In addition, the buffer layer may control a heat transfer rate during a crystallization process to form the first and second active patterns 111 and 121, so that the first and second active patterns 111 and 121 may be uniformly formed.

The gate insulating layer 112 may be disposed on the substrate 110 and the first and second active patterns 111 and 121. For example, the gate insulating layer 112 may be disposed on the substrate 110, and may cover the first and second active patterns 111 and 121. The gate insulating layer 112 may include an insulating material.

The first gate electrode 113 and the second gate electrode 123 may be disposed on the gate insulating layer 112. The first and second gate electrodes 113 and 123 may be formed by patterning a metal layer after the metal layer is deposited on the entire gate insulating layer 112. Each of the first and second gate electrodes 113 and 123 may respectively overlap each of the channel regions of the first and second active patterns 111 and 121. For example, each of the first and second gate electrodes 113 and 123 may include a metal, an alloy, a conductive metal oxide, a transparent conductive material and the like.

The interlayer insulating layer 114 may be disposed on the gate insulating layer 112 and the first and second gate electrodes 113 and 123. For example, the interlayer insulating layer 114 may be disposed on the gate insulating layer 112, and may cover the first and second gate electrodes 113 and 123. The interlayer insulating layer 114 may include an insulating material.

The first source electrode 115 and the first drain electrode 116 may be disposed on the interlayer insulating layer 114. The first source electrode 115 may be connected to the source region of the first active pattern 111 through a contact hole formed in the gate insulating layer 112 and the interlayer insulating layer 114. The first drain electrode 116 may be connected to the drain region of the first active pattern 111 through another contact hole formed in the gate insulating layer 112 and the interlayer insulating layer 114. For example, the first source electrode 115 and the first drain electrode 116 may be formed by depositing and patterning a metal material (e.g., aluminum (Al)), after the contact holes are formed in the gate insulating layer 112 and the interlayer insulating layer 114.

The second source electrode 125 and the second drain electrode 126 may be formed in a substantially same process as the first source electrode 115 and the first drain electrode 116. For example, the second source electrode 125 and the second drain electrode 126 may be formed of substantially the same material as the first source electrode 115 and the first drain electrode 116.

The via insulating layer 130 may be disposed on the interlayer insulating layer 114 and the first and second thin film transistors 117 and 127. For example, the via insulating layer 130 may be disposed on the interlayer insulating layer 114, and may cover the first and second thin film transistors 117 and 127.

The via insulating layer 130 may be include the first contact hole CNT_1 and the second contact hole CNT_2.

The first contact hole CNT_1 exposes a portion of the first drain electrode 116, and the second contact hole CNT_2 exposes a portion of the second drain electrode 126.

The via insulating layer 130 may be disposed between the substrate 110 and the first and second lower electrodes 140 and 150 to insulate wirings formed on the substrate 110 from the first and second lower electrodes 140 and 150. For example, the via insulating layer 130 may include an insulating material. The via insulating layer 130 may include an inorganic material, such as silicon nitride (SiNx), silicon oxide (SiOx), and the like, or an organic material such as a photoresist, a polyimide resin, a polyamide resin, and the like. In addition, the via insulating layer 130 may be formed in a multi-layer structure so that the first and second lower electrodes 140 and 150 are arranged on a flat surface. For example, the via insulating layer 130 may include a first via insulating layer a second via insulating layer. For example, the first via insulating layer may include siloxane, and the second via insulating layer may include the polyamide resin.

The first pixel structure PXL_1 may include the first lower electrode 140 and the first emission layer 161. The first pixel structure PXL_1 may overlap the first thin film transistor 117. The first lower electrode 140 may include the first transparent electrode 141, the first reflective electrode 143 and the second transparent electrode 145.

The first transparent electrode 141 may be disposed on the via insulating layer 130. The first transparent electrode 141 may be formed by patterning a metal layer to contact the first contact hole CNT_1 after the metal layer is deposited on the via insulating layer 130 including the first and second contact holes CNT_1 and CNT_2. Accordingly, the first transparent electrode 141 may be formed to have a same thickness along a profile of the via insulating layer 130.

In an exemplary embodiment of the present inventive concept, the first transparent electrode 141 may overlap a first region 10, a second region 20 and a third region 30. The first region 10 overlaps the first emission layer 161. The second region 20 is located in one side of the first region 10, and overlaps the first contact hole CNT_1. The third region 30 is located in the other side of the first region 10. For example, from a plan view, the second region 20 is located below the first region 10.

In an exemplary embodiment of the present inventive concept, the first transparent electrode 141 may contact the first drain electrode 116 exposed by the first contact hole CNT_1. For example, the entirety of the portion of the first drain electrode 116 that is exposed by the first contact hole CNT_1 may be in contact with the first transparent electrode 141. In an exemplary embodiment of the present inventive concept, the first transparent electrode 141 may contact a portion of the first drain electrode 116 exposed by the first contact hole CNT_1, and may not contact a remaining portion of the first drain electrode 116 exposed by the first contact hole CNT_1.

The first transparent electrode 141 may include a transparent electrode. In an exemplary embodiment of the present inventive concept, the first transparent electrode 141 may include, for example, nickel (Ni), chromium (Cr), titanium (Ti), indium tin oxide (ITO), indium zinc oxide (IZO), and the like.

The first reflective electrode 143 may be disposed on the first transparent electrode 141. The first reflective electrode 143 may be formed by patterning a metal layer to overlap the first transparent electrode 141 after the metal layer is deposited on the via insulating layer 130 and the first transparent electrode 141. In addition, a thickness of the first reflective electrode 143 may be larger than a thickness of the first transparent electrode 141.

The first reflective electrode 143 may include a reflective electrode. In an exemplary embodiment of the present inventive concept, the first reflective electrode 143 may include, for example, silver (Ag), an alloy including Ag, Al, copper (Cu), platinum (Pt), and the like.

In an exemplary embodiment of the present inventive concept, the first reflective electrode 143 may overlap only the first region 10. For example, the first reflective electrode 143 may be formed by patterning a metal layer to overlap only the first region 10 after the metal layer is deposited on the via insulating layer 130 and the first transparent electrode 141. Accordingly, the first reflective electrode 143 may not overlap the second and third regions 20 and 30. In addition, portions of the first transparent electrode 141 may be exposed in the second and third regions 20 and 30.

When a general pixel structure includes a reflective electrode, a light incident from an outside (e.g., an external light) may be reflected from the reflective electrode disposed in the second and third regions 20 and 30. The reflected light may generate a color band described above, so that the color band blurs a color of a light emitted from the pixel structure.

However, since the first reflective electrode 143 overlaps only the first region 10, the external light incident to the second and third regions 20 and 30 may not be reflected. Therefore, the color band may not be generated, and the color of the light emitted from the first pixel structure PXL_1 may be clearly recognized.

The second transparent electrode 145 may be disposed on the first reflective electrode 143. In an exemplary embodiment of the present inventive concept, the first reflective electrode 143 and the second transparent electrode 145 may be formed by simultaneously patterning metal layers after the metal layers are sequentially deposited on the via insulating layer 130 and the first transparent electrode 141.

The second transparent electrode 145 may include a transparent electrode. In an exemplary embodiment of the present inventive concept, the second transparent electrode 145 may include, for example, Ni, Cr, Ti, ITO, IZO, and the like. In an exemplary embodiment of the present inventive concept, the second transparent electrode 145 may include a substantially same material as the first transparent electrode 141.

The pixel defining layer PDL may be disposed between the first and second pixel structure PXL_1 and PXL_2 on the via insulating layer 130 and may be disposed on at least a portion of the first transparent electrode 141 and at least a portion of the third transparent electrode 151. In an exemplary embodiment of the present inventive concept, the pixel defining layer PDL may overlap the first and second contact holes CNT_1 and CNT_2. The pixel defining layer PDL may include openings. Emission materials included in the first and second emission layers 161 and 162 may be disposed in the openings, respectively. Accordingly, the pixel defining layer PDL may provide regions in which the first and second emission layers 161 and 162 are formed.

In an exemplary embodiment of the present inventive concept, the pixel defining layer PDL may function as a light blocking member. For example, the pixel defining layer PDL may include a black pigment or a black dye.

The first emission layer 161 may be disposed on the second transparent electrode 145 exposed by the opening of the pixel defining layer PDL. In an exemplary embodiment of the present inventive concept, the first emission layer 161 may overlap the first region 10.

The second pixel structure PXL_2 may include the second lower electrode 150 and the second emission layer 162. The second pixel structure PXL_2 may overlap the second thin film transistor 127. In addition, the second pixel structure PXL_2 may be spaced apart from the first pixel structure PXL_1. The second lower electrode 150 may include the third transparent electrode 151, the second reflective electrode 153, and the fourth transparent electrode 155. In addition, the second lower electrode 150 may have a shape different from a shape of the first lower electrode 140. This will be described in detail below. For example, the second lower electrode 150 may have a different configuration of elements than that of the first lower electrode 140.

The third transparent electrode 151 may be disposed on the via insulating layer 130. The third transparent electrode 151 may be formed by patterning a metal layer to contact the second contact hole CNT_2 after the metal layer is deposited on the via insulating layer 130 including the first and second contact holes CNT_1 and CNT_2. Accordingly, the third transparent electrode 151 may be formed to have a substantially constant thickness along a profile of the via insulating layer 130. In addition, as described above, the third transparent electrode 151 may be simultaneously formed with the first transparent electrode 141. For example, the third transparent electrode 151 may have a thickness that is substantially the same as that of the first transparent electrode 141.

In an exemplary embodiment of the present inventive concept, the third transparent electrode 151 may overlap a fourth region 40, a fifth region 50, and a sixth region 60. The fourth region 40 may overlap the second emission layer 162. The fifth region 50 is located in one side of the fourth region 40 and overlaps the second contact hole CNT_2. The sixth region 60 is located in the other side of the fourth region 40. For example, from a plan view, the fifth region 50 is located above the fourth region 40.

In an exemplary embodiment of the present inventive concept, the third transparent electrode 151 may contact the second drain electrode 126 exposed by the second contact hole CNT_2. For example, the entirety of the portion of the second drain electrode 126 that is exposed by the second contact hole CNT_2 may be in contact with the third transparent electrode 151. In an exemplary embodiment, the third transparent electrode 151 may contact a portion of the second drain electrode 126 exposed by the second contact hole CNT_2 and may not contact a remaining portion of the second drain electrode 126 exposed by the second contact hole CNT_2.

The third transparent electrode 151 may include a transparent electrode. In an exemplary embodiment of the present inventive concept, the third transparent electrode 151 may include, for example, Ni, Cr, Ti, ITO, IZO, and the like.

The second reflective electrode 153 may be disposed on the third transparent electrode 151. The second reflective electrode 153 may be formed by patterning a metal layer to overlap the third transparent electrode 151 after the metal layer is deposited on the via insulating layer 130 and the third transparent electrode 151. In addition, a thickness of the second reflective electrode 153 may be larger than a thickness of the third transparent electrode 151. In addition, the second reflective electrode 153 may be simultaneously formed with the first reflective electrode 143. For example, the second reflective electrode 153 may be formed of substantially the same material as the first reflective electrode 143, and the second reflective electrode 153 may have substantially the same thickness as the first reflective electrode 143. However, the present inventive concept is not limited thereto.

The second reflective electrode 153 may include a reflective electrode. In an exemplary embodiment of the present inventive concept, the second reflective electrode 153 may include, for example, Ag, Al, Cu, Pt, an alloy including Ag, and the like.

In an exemplary embodiment of the present inventive concept, the second reflective electrode 153 may overlap the fourth region 40 and the fifth region 50. For example, the second reflective electrode 153 may be formed by patterning a metal layer to overlap the fourth region 40 and the fifth region 50 after the metal layer is deposited on the via insulating layer 130 and the third transparent electrode 151. Accordingly, the second reflective electrode 153 may not overlap the sixth region 60.

The fourth transparent electrode 155 may be disposed on the second reflective electrode 153. In an exemplary embodiment of the present inventive concept, the second reflective electrode 153 and the fourth transparent electrode 155 may be formed by simultaneously patterning metal layers after the metal layers are sequentially deposited on the via insulating layer 130 and the third transparent electrode 151. In addition, the second reflective electrode 153 and the fourth transparent electrode 155 may be simultaneously formed with the first reflective electrode 143 and the second transparent electrode 145.

The fourth transparent electrode 155 may include a transparent electrode. In an exemplary embodiment of the present inventive concept, the fourth transparent electrode 155 may include, for example, Ni, Cr, Ti, ITO, IZO, and the like. In an exemplary embodiment of the present inventive concept, the fourth transparent electrode 155 may include a substantially same material as the third transparent electrode 151.

The second emission layer 162 may be disposed on the fourth transparent electrode 155 exposed by the opening of the pixel defining layer PDL. In an exemplary embodiment of the present inventive concept, the second emission layer 162 may overlap the fourth region 40.

For example, each of the first and second emission layers 161 and 162 may have a multi-layer structure including an organic light emitting layer, a hole injection layer, a hole transport layer, an electron transport layer, and an electron injection layer.

In an exemplary embodiment of the present inventive concept, the first emission layer 161 may emit a light having a first color, and the second emission layer 162 may emit a light having a second color different from the first color. Accordingly, the first color filter CF_1 corresponding to the first emission layer 161 may transmit the first color, and the second color filter CF_2 corresponding to the second emission layer 162 may transmit the second color.

The upper electrode 170 may be disposed on the pixel defining layer PDL, the first emission layer 161, and the second emission layer 162. The upper electrode 170 may be formed in a single-layer structure or a multi-layer structure including a metal film, an alloy film, a metal nitride film, a conductive metal oxide film and/or a transparent conductive material film. For example, the upper electrode 170 may include Ag, an alloy including Ag, Al, an alloy including Al, aluminum nitride (AlN), tungsten (W), tungsten nitride (WN), Cu, Ni, Cr, chromium nitride (CrN), molybdenum (Mo), an alloy including Mo, Ti, tantalum (Ta), Pt, scandium (Sc), ITO, IZO, and the like.

In an exemplary embodiment of the present inventive concept, the upper electrode 170 may include a transparent electrode. For example, the upper electrode 170 may include Ni, Cr, Ti, ITO, IZO, and the like. When the upper electrode 170 includes the transparent electrode, lights emitted by the first and second emission layers 161 and 162 may transmit through the upper electrode 170.

The thin film encapsulation layer TFE may be disposed on the upper electrode 170. The thin film encapsulation layer TFE may prevent a penetration of moisture and oxygen from an outside (e.g., an external environment). In an exemplary embodiment of the present inventive concept, the thin film encapsulation layer TFE may include a first inorganic layer, a second inorganic layer, and an organic layer disposed between the first inorganic layer and the second inorganic layer. For example, the first and second inorganic layers may include inorganic materials, and the organic layer may include an organic material.

The sensing structure 180 may be disposed on the thin film encapsulation layer TFE. In an exemplary embodiment of the present inventive concept, some components (e.g., sensing electrodes) of the sensing structure 180 may overlap the thin film encapsulation layer TFE, but the structure in which the sensing structure 180 is disposed in the display device 1000 is not limited thereto. The sensing structure 180 may detect a user's touch or a user's approach (e.g., a user's gesture that does not touch the display device 1000). In an exemplary embodiment of the present inventive concept, the sensing structure 180 may have a structure in which a plurality of sensing electrodes are formed as a multi-layer structure. For example, a capacitance may be generated by the sensing electrodes, and the sensing structure 180 may detect the user's touch or the user's approach through a capacitive method for sensing a change of the capacitance. In an exemplary embodiment of the present inventive concept, the sensing structure 180 may detect the user's touch or the user's approach through an electromagnetic induction method, a pressure detection method, an infrared method, and the like.

The black matrix BM may be disposed on the sensing structure 180. In an exemplary embodiment of the present inventive concept, the black matrix BM may overlap the pixel defining layer PDL. For example, the black matrix may not overlap the first and third transparent electrodes 141 and 151. As a width of the black matrix BM is reduced, an emission efficiency of the display device 1000 may be increased.

The black matrix BM may absorb and/or block a light. For example, the black matrix BM may include Cr, such as, chromium oxide (CrO). As the black matrix BM absorbs and/or blocks the light, a stain caused by wirings arranged in a non-emission area may not be recognized by the user.

The first and second color filters CF_1 and CF_2 may be disposed on the sensing structure 180 and the black matrix BM. Each of the first and second color filters CF_1 and CF_2 may partially overlap the black matrix BM. Colors of lights emitted by the first and second emission layers 161 and 162 may be more clearly recognized as the lights pass through the first and second color filters CF_1 and CF_2.

The display device 1000 may further include a planarization layer and a cover window disposed on the first and second color filters CF_1 and CF_2. For example, the planarization layer may be formed of a polyimide, an acrylic, or an inorganic insulating layer. The planarization layer may be disposed to compensate for an overall height of the display device 1000, and accordingly, an upper surface of the planarization layer may be a flat surface. For example, the cover window may include a glass or a plastic. In addition, the cover window may be formed of a single layer or a laminate in which a plurality of functional layers are stacked so that the cover window may protect components of the display device 1000 from an external impact.

In addition, since the display device 1000 does not include a polarizer, a weight and a thickness of the display device may be reduced, and lights emitted from the first and second emission layers 161 and 162 may be recognized more brightly.

In the display device 1000 according to an exemplary embodiment of the present inventive concept, the first reflective electrode 143 may be disposed in the first region 10, and the second reflective electrode 153 may be disposed in the fourth and fifth regions 40 and 50, so that an external light is not reflected at distal ends of the first and second lower electrodes 140 and 150. Accordingly, a reflected light emitted along a path different from a path of a light emitted from the first and second emission layer 161 and 162 may not occur, and a color band may not be generated. Since the display device 1000 does not generate the color band, a user may more clearly recognize a color of a light emitted from a pixel structure.

Figure 3:
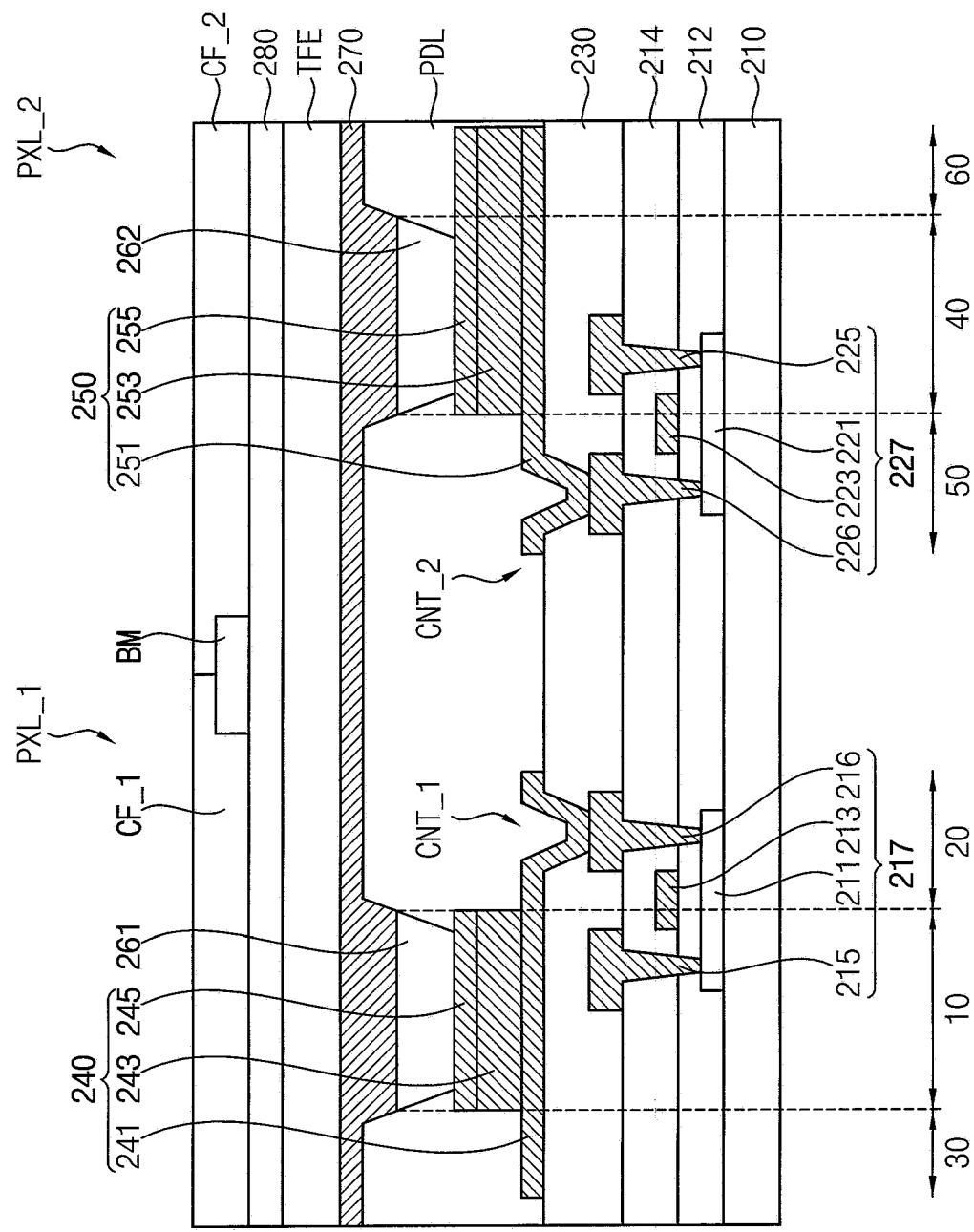
FIG. 3 is a cross-sectional view illustrating the display device according to an exemplary embodiment of the present inventive concept.

FIG. 3 is a cross-sectional view illustrating the display device according to an exemplary embodiment of the present inventive concept. For example, FIG. 3 is a cross-sectional view taken along a line I-I' of FIG. 1.

Referring to FIGS. 1 and 3, the display device 1000 may include a substrate 210, a first thin film transistor 217, a second thin film transistor 227, a gate insulating layer 212, an interlayer insulating layer 214, a via insulating layer 230, a first lower electrode 240, a second lower electrode 250, a first emission layer 261, a second emission layer 262, an upper electrode 270, a pixel defining layer PDL, a thin film encapsulation layer TFE, a sensing structure 280, a first color filter CF_1, a second color filter CF_2, and a black matrix BM.

However, since the components except the second lower electrode 250 of the display device 1000 are a substantially same as the substrate 110, the first thin film transistor 117, the second thin film transistor 127, the gate insulating layer 112, the interlayer insulating layer 114, the via insulating layer 130, the first lower electrode 140, the first emission layer 161, the second emission layer 162, the upper electrode 170, the pixel defining layer PDL, the thin film encapsulation layer TFE, the sensing structure 180, the first color filter CF_1, the second color filter CF_2, and the black matrix BM described above with reference to FIG. 2, the second lower electrode 250 will be described in detail below.

The second pixel structure PXL_2 may include the second lower electrode 250 and the second emission layer 262. The second pixel structure PXL_2 may overlap the second thin film transistor 227. In addition, the second pixel structure PXL_2 may be spaced apart from the first pixel structure PXL_1. The second lower electrode 250 may include the third transparent electrode 251, the second reflective electrode 253, and the fourth transparent electrode 255. In addition, the second lower electrode 250 may have a shape different from a shape of the first lower electrode 240.

The third transparent electrode 251 may be disposed on the via insulating layer 230. The third transparent electrode 251 may be formed by patterning a metal layer to be disposed in the second contact hole CNT_2 after the metal layer is deposited on the via insulating layer 230 including the first and second contact holes CNT_1 and CNT_2. Accordingly, the third transparent electrode 251 may be formed to have a substantially constant thickness along a profile of the via insulating layer 130. In addition, the third transparent electrode 251 may be formed simultaneously with the first transparent electrode 241.

In an exemplary embodiment of the present inventive concept, the third transparent electrode 251 may be formed in the second contact hole CNT_2.

In an exemplary embodiment of the present inventive concept, the third transparent electrode 251 may overlap the fourth region 40, the fifth region 50, and the sixth region 60. The fourth region 40 overlaps the second emission layer 262. The fifth region 50 is located in one side of the fourth region 40 and overlaps the second contact hole CNT_2. The sixth region 60 is located in the other side of the fourth region 40.

In an exemplary embodiment of the present inventive concept, the third transparent electrode 251 may contact the entire second drain electrode 226 exposed by the second contact hole CNT_2. In an exemplary embodiment of the present inventive concept, the third transparent electrode 251 may contact a portion of the second drain electrode 226 exposed by the second contact hole CNT_2, and may not contact a remaining portion of the second drain electrode 226 exposed by the second contact hole CNT_2. For example, when the third transparent electrode 251 does not contact the remaining portion, the second reflective electrode 253 and/or the fourth transparent electrode 255 may contact the remaining portion of the second drain electrode 226.

The third transparent electrode 251 may include a transparent electrode. In an exemplary embodiment of the present inventive concept, the third transparent electrode 251 may include Ni, Cr, Ti, ITO, IZO, and the like.

The second reflective electrode 253 may be disposed on the third transparent electrode 251. The second reflective electrode 253 may be formed by patterning a metal layer to overlap the third transparent electrode 251 after the metal layer is deposited on the via insulating layer 230 and the third transparent electrode 251. In addition, a thickness of the second reflective electrode 253 may be larger than a thickness of the third transparent electrode 251. In addition, the second reflective electrode 253 may be formed simultaneously with the first reflective electrode 243.

The second reflective electrode 253 may include a reflective electrode. In an exemplary embodiment of the present inventive concept, the second reflective electrode 253 may include Ag, Al, Cu, Pt, an alloy including Ag, and the like.

In an exemplary embodiment of the present inventive concept, the second reflective electrode 253 may overlap the fourth region 40 and the sixth region 60. For example, the second reflective electrode 253 may be formed by patterning a metal layer to overlap the fourth region 40 and the sixth region 60 after the metal layer is deposited on the via insulating layer 230 and the third transparent electrode 251. Accordingly, the second reflective electrode 253 may not overlap the fifth region 50.

The fourth transparent electrode 255 may be disposed on the second reflective electrode 253. In an exemplary embodiment of the present inventive concept, the second reflective electrode 253 and the fourth transparent electrode 255 may be formed by simultaneously patterning metal layers after the metal layers are deposited on the via insulating layer 230 and the third transparent electrode 251. In addition, the second reflective electrode 253 and the fourth transparent electrode 255 may be formed simultaneously with the first reflective electrode 243 and the second transparent electrode 245.

The fourth transparent electrode 255 may include a transparent electrode. In an exemplary embodiment of the present inventive concept, the fourth transparent electrode 255 may include, for example, Ni, Cr, Ti, ITO, IZO, and the like. In an exemplary embodiment of the present inventive concept, the fourth transparent electrode 255 may include a substantially same material as the third transparent electrode 251.

Figure 4:
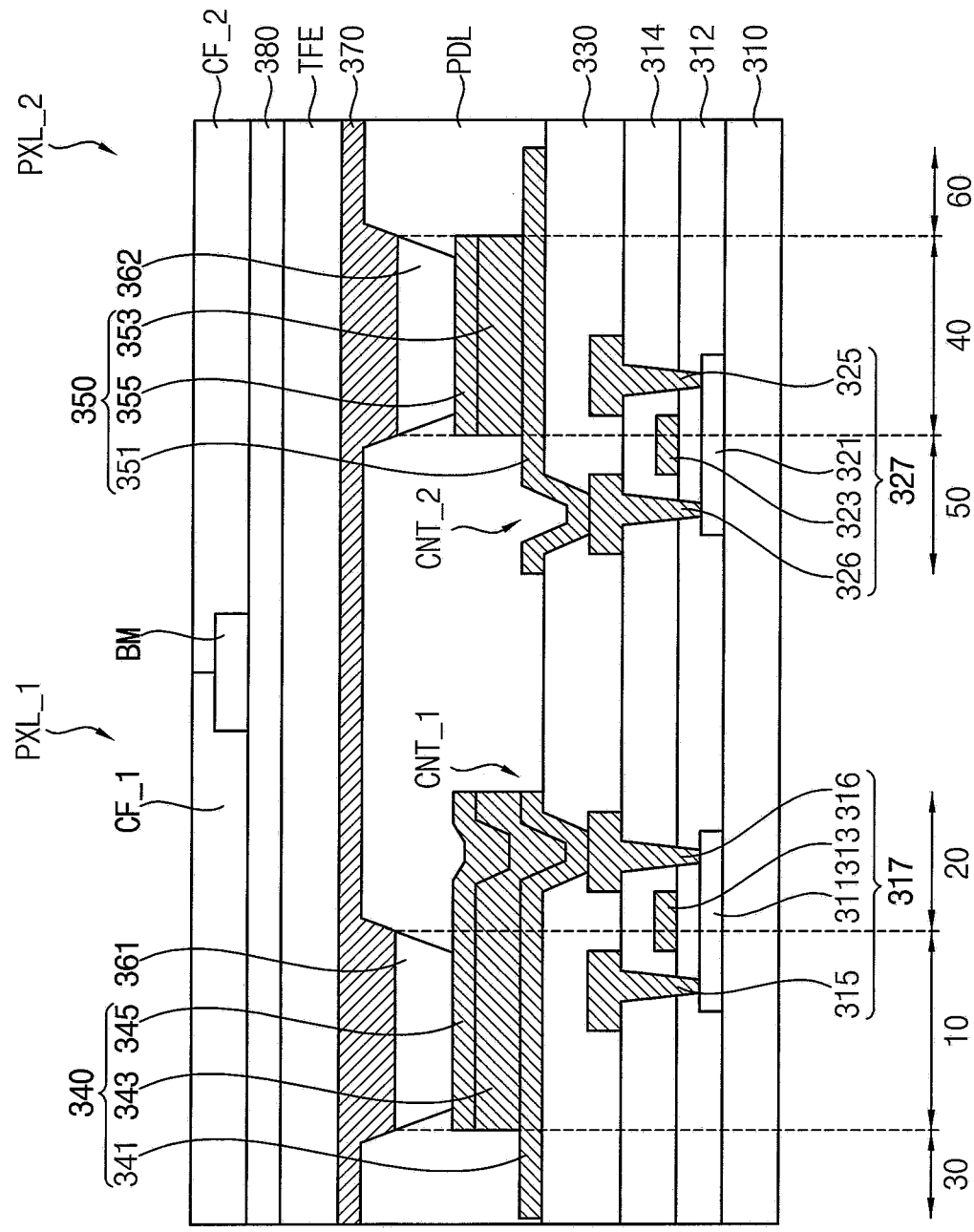
FIG. 4 is a cross-sectional view illustrating the display device according to an exemplary embodiment of the present inventive concept.

FIG. 4 is a cross-sectional view illustrating the display device according to an exemplary embodiment of the present inventive concept. For example, FIG. 4 is a cross-sectional view taken along a line I-I' of FIG. 1.

Referring to FIGS. 1 and 4, the display device 1000 may include a substrate 310, a first thin film transistor 317, a second thin film transistor 327, a gate insulating layer 312, an interlayer insulating layer 314, a via insulating layer 330, a first lower electrode 340, a second lower electrode 350, a first emission layer 361, a second emission layer 362, an upper electrode 370, a pixel defining layer PDL, a thin film encapsulation layer TFE, a sensing structure 380, a first color filter CF_1, a second color filter CF_2, and a black matrix BM.

However, since the components except the first and second lower electrodes 340 and 350 of the display device 1000 are a substantially same as the substrate 110, the first thin film transistor 117, the second thin film transistor 127, the gate insulating layer 112, the interlayer insulating layer 114, the via insulating layer 130, the first emission layer 161, the second emission layer 162, the upper electrode 170, the pixel defining layer PDL, the thin film encapsulation layer TFE, the sensing structure 180, the first color filter CF_1, the second color filter CF_2, and the black matrix BM described above with reference to FIG. 2, the first and second lower electrodes 340 and 350 will be described in detail below.

The first pixel structure PXL_1 may include the first lower electrode 340 and the first emission layer 361. The first pixel structure PXL_1 may overlap the first thin film transistor 317. The first lower electrode 340 may include a first transparent electrode 341, a first reflective electrode 343, and a second transparent electrode 345. Since the first transparent electrode 341 is a substantially same as the first transparent electrode 141 described above with reference to FIG. 2, the first reflective electrode 343 and the second transparent electrode 345 will be described in detail below.

The first reflective electrode 343 may be disposed on the first transparent electrode 341. The first reflective electrode 343 may be formed by patterning a metal layer to overlap the first transparent electrode 341 after the metal layer is deposited on the via insulating layer 330 and the first transparent electrode 341. In addition, a thickness of the first reflective electrode 343 may be larger than a thickness of the first transparent electrode 341.

In an exemplary embodiment of the present inventive concept, the first reflective electrode 343 may overlap the first region 10 and the second region 20. For example, the first reflective electrode 343 may be formed by patterning a metal layer to overlap the first region 10 and the second region 20 after the metal layer is deposited on the via insulating layer 330 and the first transparent electrode 341. Accordingly, the first reflective electrode 343 may not overlap the third region 30.

The second transparent electrode 345 may be disposed on the first reflective electrode 343. In an exemplary embodiment of the present inventive concept, the first reflective electrode 343 and the second transparent electrode 345 may be formed by simultaneously patterning metal layers after the metal layers are deposited on the via insulating layer 330 and the first transparent electrode 341.

The second pixel structure PXL_2 may include the second lower electrode 350 and the second emission layer 362. The second pixel structure PXL_2 may overlap the second thin film transistor 327. In addition, the second pixel structure PXL_2 may be spaced apart from the first pixel structure PXL_1. The second lower electrode 350 may include a third transparent electrode 351, a second reflective electrode 353, and a fourth transparent electrode 355. In addition, the second lower electrode 350 may have a shape different from a shape of the first lower electrode 340. This will be described in detail below. Since the third transparent electrode 351 is a substantially same as the third transparent electrode 151 described above with reference to FIG. 2, the second reflective electrode 353 and the fourth transparent electrode 355 will be described in detail below.

The second reflective electrode 353 may be disposed on the third transparent electrode 351. The second reflective electrode 353 may be formed by patterning a metal layer to overlap the third transparent electrode 351 after the metal layer is deposited on the via insulating layer 330 and the third transparent electrode 351. In addition, a thickness of the second reflective electrode 353 may be larger than a thickness of the third transparent electrode 351. In addition, the second reflective electrode 353 may be formed simultaneously with the first reflective electrode 343.

In an exemplary embodiment of the present inventive concept, the second reflective electrode 353 may overlap only the fourth region 40. For example, the second reflective electrode 353 may be formed by patterning a metal layer to overlap only the fourth region 40 after the metal layer is deposited on the via insulating layer 330 and the third transparent electrode 351. Accordingly, the second reflective electrode 353 may not overlap the fifth and sixth regions 50 and 60.

The fourth transparent electrode 355 may be disposed on the second reflective electrode 353. In an exemplary embodiment of the present inventive concept, the second reflective electrode 353 and the fourth transparent electrode 355 may be formed by simultaneously patterning metal layers after the metal layers are sequentially deposited on the via insulating layer 330 and the third transparent electrode 351.

Figure 5:
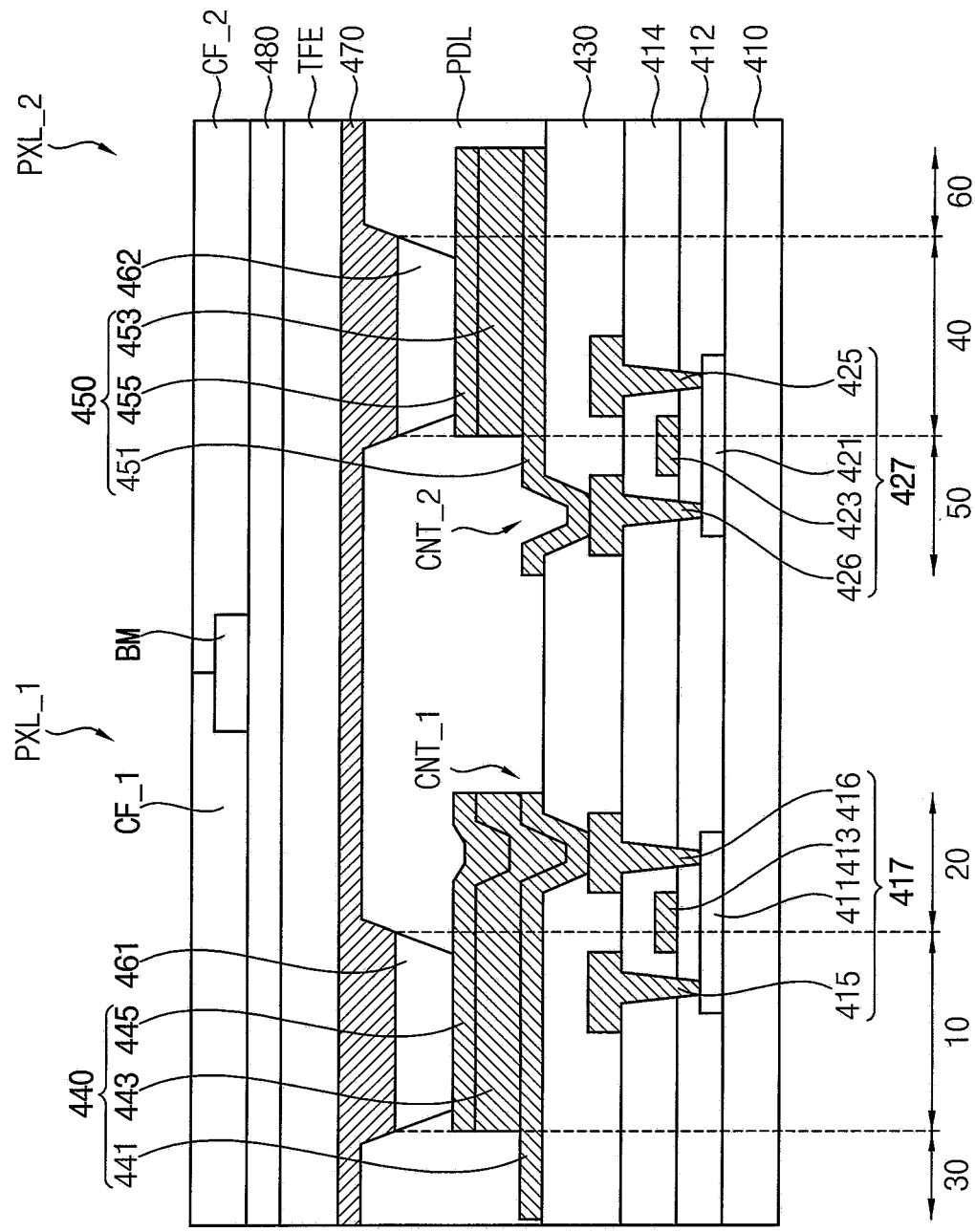
FIG. 5 is a cross-sectional view illustrating the display device according to an exemplary embodiment of the present inventive concept.

FIG. 5 is a cross-sectional view illustrating the display device according to an exemplary embodiment of the present inventive concept. For example, FIG. 5 is a cross-sectional view taken along a line I-I' of FIG. 1.

Referring to FIGS. 1 and 5, the display device 1000 may include a substrate 410, a first thin film transistor 417, a second thin film transistor 427, a gate insulating layer 412, an interlayer insulating layer 414, a via insulating layer 430, a first lower electrode 440, a second lower electrode 450, a first emission layer 461, a second emission layer 462, an upper electrode 470, a pixel defining layer PDL, a thin film encapsulation layer TFE, a sensing structure 480, a first color filter CF_1, a second color filter CF_2, and a black matrix BM.

The components of FIG. 5 except the first lower electrode 440 of the display device 1000 are a substantially same as the substrate 210, the first thin film transistor 217, the second thin film transistor 227, the gate insulating layer 212, the interlayer insulating layer 214, the via insulating layer 230, the second lower electrode 250, the first emission layer 261, the second emission layer 262, the upper electrode 270, the pixel defining layer PDL, the thin film encapsulation layer TFE, the sensing structure 280, the first color filter CF_1, the second color filter CF_2, and the black matrix BM described above with reference to FIG. 3. In addition, the first lower electrode 440 may be a substantially same as the first lower electrode 340 described above with reference to FIG. 4.

Figure 6:
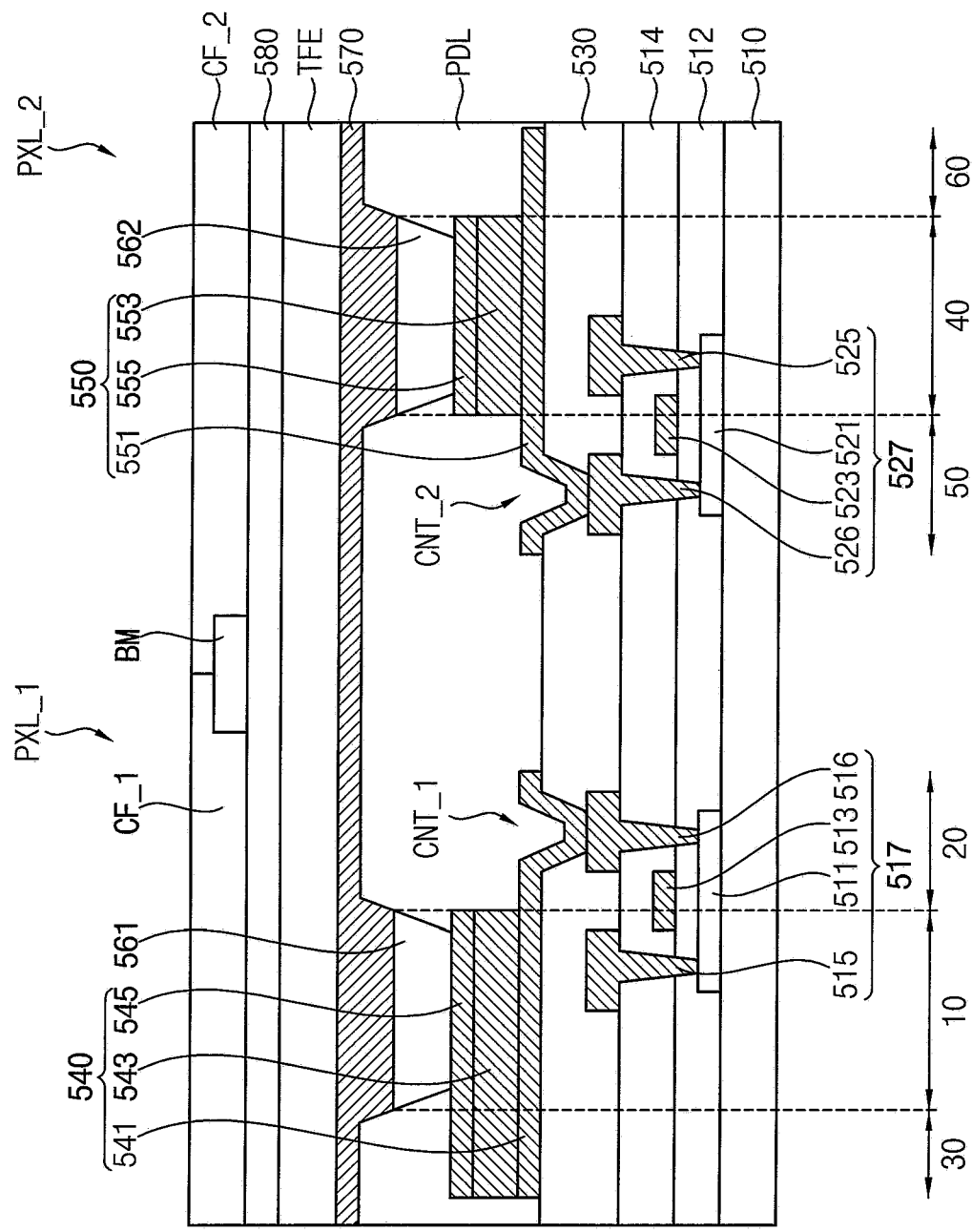
FIG. 6 is a cross-sectional view illustrating the display device according to an exemplary embodiment of the present inventive concept.

FIG. 6 is a cross-sectional view illustrating the display device according to an exemplary embodiment of the present inventive concept. For example, FIG. 6 is a cross-sectional view taken along a line I-I' of FIG. 1.

Referring to FIGS. 1 and 6, the display device 1000 may include a substrate 510, a first thin film transistor 517, a second thin film transistor 527, a gate insulating layer 512, an interlayer insulating layer 514, a via insulating layer 530, a first lower electrode 540, a second lower electrode 550, a first emission layer 561, a second emission layer 562, an upper electrode 570, a pixel defining layer PDL, a thin film encapsulation layer TFE, a sensing structure 580, a first color filter CF_1, a second color filter CF_2, and a black matrix BM.

However, since the components except the first lower electrode 540 of the display device 1000 are a substantially same as the substrate 310, the first thin film transistor 317, the second thin film transistor 327, the gate insulating layer 312, the interlayer insulating layer 314, the via insulating layer 330, the second lower electrode 350, the first emission layer 361, the second emission layer 362, the upper electrode 370, the pixel defining layer PDL, the thin film encapsulation layer TFE, the sensing structure 380, the first color filter CF_1, the second color filter CF_2, and the black matrix BM described above with reference to FIG. 4, the first lower electrode 540 will be described in detail below.

The first pixel structure PXL_1 may include the first lower electrode 540 and the first emission layer 561. The first pixel structure PXL_1 may overlap the first thin film transistor 517. The first lower electrode 140 may include a first transparent electrode 541, a first reflective electrode 543, and a second transparent electrode 545. Since the first transparent electrode 541 may be a same as the first transparent electrode 341 described above with reference to FIG. 4, the first reflective electrode 543 and the second transparent electrode 545 will be described in detail below.

The first reflective electrode 543 may be disposed on the first transparent electrode 541. The first reflective electrode 543 may be formed by patterning a metal layer to overlap the first transparent 541 after the metal layer is deposited on the via insulating layer 530 and the first transparent electrode 541. In addition, a thickness of the first reflective electrode 543 may be larger than a thickness of the first transparent electrode 541.

In an exemplary embodiment of the present inventive concept, the first reflective electrode 543 may overlap the first region 10 and the third region 30. For example, the first reflective electrode 543 may be formed by patterning a metal layer to overlap the first region 10 and the third region 30 after the metal layer is deposited on the via insulating layer 530 and the first transparent electrode 541. Accordingly, the first reflective electrode 543 may not overlap the second region 20.

The second transparent electrode 545 may be disposed on the first reflective electrode 543. In an exemplary embodiment of the present inventive concept, the first reflective electrode 543 and the second transparent electrode 545 may be formed by simultaneously patterning metal layers after the metal layers are deposited on the via insulating layer 530 and the first transparent electrode 541.

Figure 7:
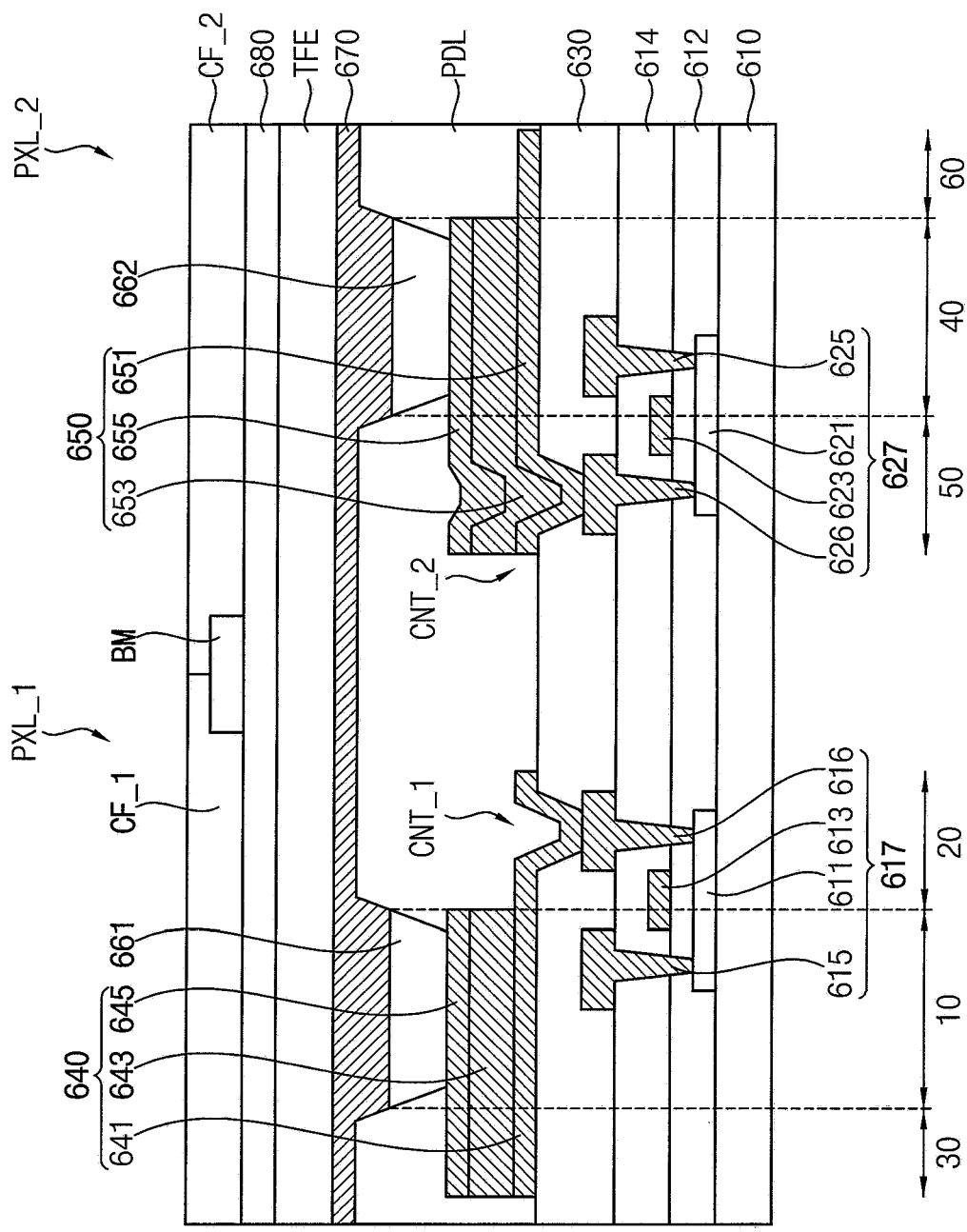
FIG. 7 is a cross-sectional view illustrating the display device according to an exemplary embodiment of the present inventive concept.

FIG. 7 is a cross-sectional view illustrating the display device according to an exemplary embodiment of the present inventive concept. For example, FIG. 7 is a cross-sectional view taken along a line I-I' of FIG. 1.

Referring to FIGS. 1 and 7, the display device 1000 may include a substrate 610, a first thin film transistor 617, a second thin film transistor 627, a gate insulating layer 612, an interlayer insulating layer 614, a via insulating layer 630, a first lower electrode 640, a second lower electrode 650, a first emission layer 661, a second emission layer 662, an upper electrode 670, a pixel defining layer PDL, a thin film encapsulation layer TFE, a sensing structure 680, a first color filter CF_1, a second color filter CF_2, and a black matrix BM.

The components except the first lower electrode 640 of the display device 1000 are a substantially same as the substrate 110, the first thin film transistor 117, the second thin film transistor 127, the gate insulating layer 112, the interlayer insulating layer 114, the via insulating layer 130, the second lower electrode 150, the first emission layer 161, the second emission layer 162, the upper electrode 170, the pixel defining layer PDL, the thin film encapsulation layer TFE, the sensing structure 180, the first color filter CF_1, the second color filter CF_2, and the black matrix BM described above with reference to FIG. 2. In addition, the first lower electrode 640 may be a substantially same as the first lower electrode 540 described above with reference to FIG. 6.

Figure 8:
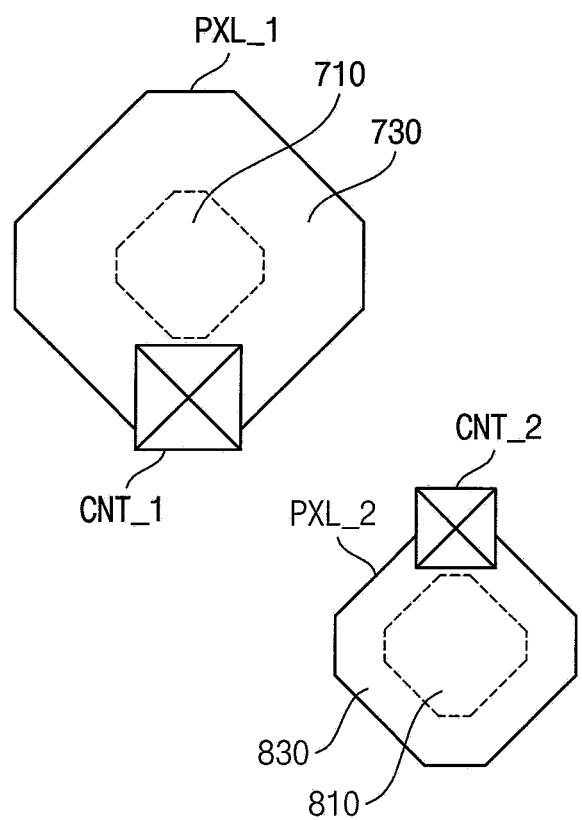
FIG. 8 is a cross-sectional view illustrating the display device according to an exemplary embodiment of the present inventive concept.

FIG. 8 is a cross-sectional view illustrating the display device according to an exemplary embodiment of the present inventive concept. For example, FIG. 8 is an enlarged view of an area A of FIG. 1.

Referring to FIGS. 1 and 8, the first pixel structure PXL_1 and the second pixel structure PXL_2 may be arranged in a pentile manner in the display area DA of the display device 1000.

The first pixel structure PXL_1 may be divided into a first central region 710 and a first peripheral region 730. The first central region 710 may be provided by the opening of the pixel defining layer PDL described above with reference to FIGS. 2 to 7. The first peripheral region 730 may surround the first central region 710, and may overlap the pixel defining layer PDL.

The first pixel structure PXL_1 may include a first lower electrode, and the first lower electrode may include a first transparent electrode, a first reflective electrode disposed on the first transparent electrode, and a second transparent electrode disposed on the first reflective electrode.

The first transparent electrode may overlap the first central region 710 and the first peripheral region 730. In an exemplary embodiment of the present inventive concept, the first reflective electrode and the second transparent electrode may overlap only the first central region 710. In an exemplary embodiment of the present inventive concept, the first reflective electrode and the second transparent electrode may extend to overlap the first central region 710 and at least a region of the first peripheral region 730.

The second pixel structure PXL_2 may be divided into a second central region 810 and a second peripheral region 830. The second central region 810 may be provided by the opening of the pixel defining layer PDL described above with reference to FIGS. 2 to 7. The second peripheral region 830 may surround the first central region 810, and may overlap the pixel defining layer PDL.

The second pixel structure PXL_2 may include a second lower electrode, and the second lower electrode may include a third transparent electrode, a second reflective electrode disposed on the third transparent electrode, and a fourth transparent electrode disposed on the second reflective electrode.

The third transparent electrode may overlap the second central region 810 and the second peripheral region 830. In an exemplary embodiment of the present inventive concept, the second reflective electrode and the fourth transparent electrode may overlap only the second central region 810. In an exemplary embodiment of the present inventive concept, the second reflective electrode and the fourth transparent electrode may extend to overlap the second central region 810 and at least a region of the second peripheral region 830.

The present inventive concept may be applied to a display device and an electronic device using the display device. For example, the present inventive concept may be applied to a cellular phone, a smart phone, a video phone, a smart pad, a smart watch, a tablet personal computer (PC), a car navigation system, a television, a computer monitor, a laptop, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display device, comprising:
   a substrate;
   a via insulating layer disposed on the substrate;
   a first lower electrode disposed on the via insulating layer; and
   a second lower electrode disposed on the via insulating layer, wherein the second lower electrode has a shape different from a shape of the first lower electrode,
   wherein the first lower electrode includes a first transparent electrode, a first reflective electrode, and a second transparent electrode,
   wherein the second lower electrode includes a third transparent electrode, a second reflective electrode, and a fourth transparent electrode,
   wherein the first transparent electrode overlaps a first central region of the first lower electrode and a first peripheral region, which is surrounding the first central region, of the first lower electrode,
   wherein the first reflective electrode is disposed on the first transparent electrode and overlaps the first central region,
   wherein the second transparent electrode is disposed on the first reflective electrode and overlaps the first central region, wherein the first reflective electrode and the second transparent electrode do not cover a portion of a top surface of the first transparent electrode,
   wherein the third transparent electrode overlaps a second central region of the second lower electrode and a second peripheral region, which is surrounding the second central region, of the second lower electrode,
   wherein the second reflective electrode is disposed on the third transparent electrode and overlaps the second central region, and
   wherein the fourth transparent electrode is disposed on the second reflective electrode and overlaps the second central region.

2. The display device of claim 1, further including:
   a pixel defining layer overlapping the first and second peripheral regions.

3. The display device of claim 1, wherein the first reflective electrode extends to overlap at least a region of the first peripheral region.

* * * * *